(12) United States Patent
Fasano (10) Patent No.: US 10,211,003 B1
(45) Date of Patent: Feb. 19, 2019

(54) SINGLE POLE DC CIRCUIT BREAKER WITH BI-DIRECTIONAL ARC CHAMBER

(71) Applicant: Carling Technologies, Inc., Plainville, CT (US)

(72) Inventor: Michael Fasano, Watertown, CT (US)

(73) Assignee: Carling Technologies, Inc., Plainville, CT (US)

( * ) Notice: Subject to any disclaimer, the term of this patent is extended or adjusted under 35 U.S.C. 154(b) by 0 days.

(21) Appl. No.: 15/821,517

(22) Filed: Nov. 22, 2017

(51) Int. Cl.
| H01H 9/44 | (2006.01) |
| H01H 9/02 | (2006.01) |
| H01H 9/34 | (2006.01) |
| G01R 19/165 | (2006.01) |

(52) U.S. Cl.
CPC ....... *H01H 9/443* (2013.01); *G01R 19/16538* (2013.01); *H01H 9/02* (2013.01); *H01H 9/34* (2013.01)

(58) Field of Classification Search
CPC ............ H01H 9/443; H01H 9/02; H01H 9/34; H01H 1/36; H01H 33/08; H01H 71/0207; G01R 19/16538
USPC ................ 218/156, 155, 149, 23, 26, 27, 30
See application file for complete search history.

(56) References Cited

U.S. PATENT DOCUMENTS

| 5,138,122 | A | * | 8/1992 | Moldovan | ................. H01H 9/34 218/22 |
| 8,502,102 | B2 | * | 8/2013 | Eriksson | ................... H01H 9/40 218/150 |
| 8,822,866 | B2 | | 9/2014 | Fasano | |
| 8,866,034 | B2 | | 10/2014 | Fasano | |
| 9,224,558 | B2 | * | 12/2015 | Gerving | ................. H01H 33/18 |
| 9,406,465 | B1 | | 8/2016 | Fasano | |
| 2013/0264310 | A1 | * | 10/2013 | Lang | ........................ H01H 1/20 218/2 |
| 2013/0313228 | A1 | | 11/2013 | Friedrichsen et al. | |

* cited by examiner

*Primary Examiner* — Edwin A. Leon
*Assistant Examiner* — William Bolton
(74) *Attorney, Agent, or Firm* — Forge IP, PLLC (57) ABSTRACT

A DC voltage circuit interrupter that provides polarity insensitive arc suppression. The circuit interrupter includes two permanent magnets that are positioned in proximity to each of the contacts in the circuit interrupter and is designed to urge an arc that develops between the contacts either toward a first arc extinguisher or a second arc extinguisher depending on the polarity of the applied DC voltage. The circuit interrupter being quick to assemble, light-weight and relatively inexpensive and easy to mount.

30 Claims, 4 Drawing Sheets

SINGLE POLE DC CIRCUIT BREAKER WITH BI-DIRECTIONAL ARC CHAMBER

FIELD OF THE INVENTION

The present invention relates generally to the protection of electrical devices, and more specifically, to arc extinguishing structures that are configured to rapidly extinguish an electrical arc regardless of the polarity of current through a circuit interrupter.

BACKGROUND OF THE INVENTION

Circuit interrupters are electrical components that are used to open an electrical circuit, interrupting the flow of current. A basic example of a circuit interrupter is a switch, which generally consists of two electrical contacts in one of two states; either closed, meaning that the contacts are in electrical contact with each other allowing electricity to flow between them, or open, meaning that the contacts are not in electrical contact with each other preventing the flow of electricity. A switch may be directly manipulated to provide a control signal to a system, such as a computer keyboard button, or to control power flow in a circuit, such as a light switch.

Another example of a circuit interrupter is a circuit breaker. A circuit breaker may be used, for example, in an electrical panel to limit the amount of current flowing through the electrical wiring. A circuit breaker is designed to protect an electrical circuit from damage caused by, for example, an overload, a ground fault or a short circuit. If a fault condition, such as a power surge occurs in the electrical wiring, the breaker will trip. This will cause a breaker that was in an "on" position to flip to an "off" position and interrupt the flow of electrical power through the breaker. Circuit breakers are generally provided to protect the electrical wiring by limiting the amount of current transmitted through the wires to a level that will not damage them. Circuit breakers can also prevent destruction of the devices that may draw too much current.

A standard circuit breaker has a terminal connected to a source of electrical power, such as a power line electrically connected to the secondary of a power company transformer, and a second terminal electrically connected to the wires that the breaker is intended to protect. Conventionally, these terminals are referred to as the "line" and "load" respectively. The line is sometimes referred to as the input of the circuit breaker. The load is sometimes referred to as the output of the circuit breaker, which connects to the electrical circuit and components receiving the electrical power.

An individual protected device, such as a single air conditioner, may be directly connected to a circuit breaker. Alternatively, circuit breakers may also be used to protect the wiring feeding multiple devices that may be connected to the circuit via various electrical outlets (e.g., various devices in a room each plugged into an outlet all on the same circuit fed by the same circuit breaker).

A circuit breaker can be used as a replacement for a fuse. Unlike a fuse however, which typically operates to open in an over current situation and then must be replaced; a circuit breaker can be "reset" (either manually or automatically) to resume operation. Fuses perform a similar role to circuit breakers, however, circuit breakers are easier to use and typically safer to service and operate.

Unlike the situation when a fuse blows, when a circuit breaker trips, it is relatively easy to determine which circuit breaker feeds the interrupted circuit by looking at the electrical panel and noting which breaker has a handle in the "tripped" position. This breaker can then be simply moved to the "off" position (which resets the circuit breaker), and then moved to the "on" position and power will resume.

In general, a single pole circuit interrupter has two contacts positioned inside of a housing. The first contact is stationary and may be connected to either the line or the load. The second contact is movable with respect to the first contact, such that when the circuit breaker is in the "off" or "tripped" position, a gap exists between the first and second contact.

A problem with the above-described circuit interrupters arises when energized contacts are opened while under load. As the contacts separate, transitioning from a closed to an open position, or when the opposite occurs, an electric arc may be formed in the gap between the contacts. An electrical arc is a plasma discharge between two points that is caused by electrical current that ionizes gasses in the air between the two points.

The creation of an arc during transition of the contacts can result in undesirable effects that negatively affect the operation of the circuit interrupter, even potentially creating a safety hazard. These negative effects can also have adverse consequences on the functioning of the circuit interrupter.

One possible consequence is that the arc may short to objects inside the circuit interrupter and/or to surrounding objects, causing damage and presenting a potential fire or safety hazard.

Another consequence of arcing is that the arc energy damages the contacts themselves, causing some material to escape into the air as fine particulate matter. The debris that has been melted off of the contacts can migrate or be flung into the mechanism of the circuit interrupter, destroying the mechanism or reducing its operational lifespan.

Still another effect of arcing is due to the extremely high temperature of the arc (tens of thousands of degrees Celsius), which can impact the surrounding gas molecules creating ozone, carbon monoxide, and other dangerous compounds. The arc can also ionize surrounding gasses, potentially creating alternate conduction paths.

Because of these detrimental effects it is very important to quickly suppress or quench the arc to prevent the above-described situations. Various techniques for improved arc quenching are known. For example, U.S. Pat. Nos. 8,822,866 and 8,866,034 assigned to Carling Technologies, Inc., variously relate to the use of an electromagnetic field to guide an arc toward an arc splitter.

However, generating an electromagnetic field to move an arc requires the use of power, and generates heat in the device. In order to avoid these negative issues, it has been conceived to incorporate a permanent magnet into the circuit interrupter, which produces a magnetic field without requiring a supply of electricity. However, permanent magnets produce a magnetic field having a fixed direction with respect to the magnet. Thus, known solutions for guiding an arc into an arc path using a permanent magnet are circuit polarity dependent. This is due to the fact that a magnetic field produced by a fixed permanent magnet has a fixed direction. As such, the mechanism for magnetically guiding the arc into the path depends upon the direction the current is flowing through the circuit interrupter.

U.S. Patent Application Publication No. 2013/0313228 (the '228 application) is directed to a switch including two sets of contacts in series that are designed to be used with D.C. voltage where an arc that occurs between either set of contacts will be disapated regardless of the polarity of the D.C. voltage. The '228 application teaches that "the magnets are always arranged in opposing pairs, in order to be able to generate a homogeneous magnetic field perpendicular to the current direction through the arcs and perpendicular to the arc deflector plates, contact deflector plates and bridge plates." [0027]. Accordingly, the '228 application requires the use of two pairs of relatively large plate-type magnets as well as the specific configuration for the "arc deflector plates" and "contact deflector plates." This results in a fairly large and bulky arraignment, which requires additional materials increasing the cost of the device.

U.S. Pat. No. 9,406,465 (the '465 patent) is also focused on providing a circuit interrupter having an arc extinguisher that functions to arrest an arc between the circuit interrupter contacts regardless of the polarity of the circuit. In particular, the '465 patent discloses that this is achieved by placing a permanent magnet such that if an arc develops, the arc is driven into a first arc path when a polarity of the first contact is positive and the arc is driven into a second arc path when a polarity of the first contact is negative. However, the '465 patent also includes embodiments where a set of magnets are positioned laterally to the set of contacts as disclosed in the '228 application. In one embodiment, the '465 patent discloses a single magnet that is positioned below the stationary contact, but again, while effective in driving and arc that may develop, the magnet is relatively large in size in order to generate the magnetic field to drive and arc.

It is therefore desired to provide arc quenching usable with a circuit interrupter that overcomes the above-described limitations.

SUMMARY OF THE INVENTION

Accordingly, it is an object of the present invention to provide a circuit interrupter having an arc extinguisher that functions to arrest an arc between the circuit interrupter contacts regardless of the polarity of the circuit and does not significantly add to the weight of the circuit interrupter.

It is a further object of the present invention to provide a circuit interrupter having an arc extinguisher that functions to arrest an arc between the circuit interrupter contacts regardless of the polarity of the circuit and does not significantly add to the size of the circuit interrupter.

It is a further object of the present invention to provide a circuit interrupter having an arc extinguisher that functions to arrest an arc between the circuit interrupter contacts regardless of the polarity of the circuit and does not significantly add to the complexity and cost of the circuit interrupter.

These and other objectives are achieved by providing a circuit interrupter that includes a first moveable contact and a second stationary contact. The stationary contact is positioned on a stationary contact arm that is elongated and generally flat extending laterally to each side of the stationary contact. One end of the stationary contact arm extends toward a first arc extinguisher and a second end of the stationary contact arm extends toward a second arc extinguisher. The stationary contact is positioned toward the middle of and on a lower side of the stationary contact arm. A stationary permanent magnet is positioned on an upper side of the stationary contact arm such that it is above and axially in line with the stationary contact.

A moveable contact arm is provided that is generally flat and has a moveable contact mounted on an upper side thereof. The moveable contact arm is also provide with a first end and a second end where the first end of the moveable contact arm extends toward the first arc extinguisher and the second end the moveable contact arm extends toward the second arc extinguisher. In addition, a moveable magnet is positioned on a lower side of the moveable contact arm such that it is below and axially in line with the moveable contact.

The moveable contact arm functions to move the moveable contact into and out of physical contact with the stationary contact. The stationary magnet and the moveable magnet are positioned such that, when they come in proximity to each other, the magnetic fields generated by the two magnets are additive.

The first arc extinguisher may comprise a plurality of vertically stacked arc plates that are spaced apart from each other. The first end of the stationary contact arm extends over top of the upper most arc plate in the first arc extinguisher. The second arc extinguisher also comprises a plurality of vertically stacked arc plates that are spaced apart from each other. The second end of the stationary contact arm extends over top of the upper most arc plate in the second arc extinguisher. In this manner, depending on the polarity of the DC voltage applied to the contacts, when an arc occurs, the arc will be urged due to the additive magnetic field, toward either the first or the second arc extinguisher. The arc is passed from the contacts to the contact arms and then drawn into the respective arc extinguisher depending on the polarity of the DC voltage.

As the permanent magnets are positioned directly above and below the stationary and moveable contacts respectively, they do not have to be of large size or heavy as their magnetic fields are designed to be additive when in close proximity to each other.

In another configuration, the system is provided such that the arc plates are split in a U shape configuration with the two "legs" of the arc plates extending toward the contacts.

Still further the stationary contact arm can be provided with a cut out having a proximal end and a distal end extending longitudinally along a length of each side of the arm. A center piece may be attached at the proximal end of each cut out and extend some distance toward the distal end of the respective cut out. In one configuration, the stationary contact arm is formed in an S shape configuration where the center piece is positioned, for a least a portion of its length, in a different plane than the stationary contact arm.

In yet another configuration, the moveable contact arm is formed with the ends offset in a different plane than a center portion of the moveable contact arm.

It is still further contemplated that a lower arc runner formed as a substantially flat flexible conductor may be provided below the first and second arc extinguishers and below the contacts. This lower arc runner may function as the lowermost arc plate for each of the first and second arc extinguishers. Additionally toward a middle section of the lower arc runner raised portions may be provided such that when the moveable contact opens, the ends of the moveable contact arm come within proximity to the raised portions of the lower arc runner so that any arc that is developed can be passed toward the lower arc runner and proceed toward the arc plates of the respective arc extinguisher.

The circuit interrupter may be configured as a circuit breaker and include the various parts and pieces typically associated with a circuit breaker including a line terminal, a load terminal, an overcurrent measurement device, a handle that extends from the top of a housing within which the working parts of the circuit breaker are maintained. Additionally, the housing may be formed to be a "plug-in" type circuit breaker, a "screw on" type circuit breaker both of which may be mounted in an electrical panel board; or the housing could be designed to be affixed to surface mounted DIN rail.

For this application the following terms and definitions shall apply:

The terms "first" and "second" are used to distinguish one element, set, data, object or thing from another, and are not used to designate relative position or arrangement in time.

The terms "coupled", "coupled to", "coupled with", "connected", "connected to", and "connected with" as used herein each mean a relationship between or among two or more devices, apparatus, files, programs, applications, media, components, networks, systems, subsystems, and/or means, constituting any one or more of (a) a connection, whether direct or through one or more other devices, apparatus, files, programs, applications, media, components, networks, systems, subsystems, or means, (b) a communications relationship, whether direct or through one or more other devices, apparatus, files, programs, applications, media, components, networks, systems, subsystems, or means, and/or (c) a functional relationship in which the operation of any one or more devices, apparatus, files, programs, applications, media, components, networks, systems, subsystems, or means depends, in whole or in part, on the operation of any one or more others thereof.

In one configuration a DC voltage circuit interrupter is provided comprising a stationary contact arm formed as a substantially flat elongated piece having a first end and a second end, a stationary contact positioned on an under side of and toward a middle portion of the stationary contact arm and a stationary magnet positioned on an upper side of and toward the middle portion of the stationary contact arm, the stationary magnet generating a stationary magnetic field. The DC voltage circuit interrupter also comprises a moveable contact arm formed as a substantially flat elongated piece having a first end and a second end, a moveable contact positioned on an upper side of and toward a middle portion of the moveable contact arm and a moveable magnet positioned on an under side of and toward the middle portion of the moveable contact arm, the moveable magnet generating a moveable magnetic field. The DC voltage circuit interrupter is provided such that the stationary magnetic field and the moveable magnetic field are additive with respect to each other and the moveable contact arm is displaceable along a linear path where the moveable contact physically contacts the stationary contact in a closed position, and the moveable contact does not physically contact the stationary contact in an open position. The DC voltage circuit interrupter further comprises a first arc extinguisher positioned below the first end of the stationary contact arm and a second arc extinguisher positioned below the second end of the stationary contact arm. Finally, the DC voltage circuit interrupter is provided such that when an arc occurs between the stationary contact and the moveable contact, the magnetic field is provided to urge the arc off of the contacts and onto the stationary contact arm and moveable contact arm and toward either the first or second arc extinguisher depending on the polarity of the DC voltage.

In another configuration a DC voltage circuit interrupter is provided comprising a stationary contact arm formed as a substantially flat elongated piece having a first end, a second end, an elongated cut out and a center piece attached to a proximal end of the elongated cut out and extending toward a distal end of the cut out. The DC voltage circuit interrupter is provided such that the center piece is coplanar with the second end. The DC voltage circuit interrupter also comprises a stationary contact positioned on an under side of and toward a middle portion of the stationary contact arm and a stationary magnet positioned on an upper side of and toward the middle portion of the stationary contact arm, the stationary magnet generating a stationary magnetic field. The DC voltage circuit interrupter further comprises a moveable contact arm formed as a substantially flat elongated piece having a first end and a second end, a moveable contact positioned on an upper side of and toward a middle portion of the moveable contact arm and a moveable magnet positioned on an under side of and toward the middle portion of the moveable contact arm, the moveable magnet generating a moveable magnetic field. The DC voltage circuit interrupter is provided such that the moveable contact arm is displaceable along a linear path where the moveable contact physically contacts the stationary contact in a closed position, and the moveable contact does not physically contact the stationary contact in an open position. Finally, the DC voltage circuit interrupter comprises a first arc extinguisher positioned below the center piece and a second arc extinguisher positioned below the second end of the stationary contact arm.

Other objects of the invention and its particular features and advantages will become more apparent from consideration of the following drawings and accompanying detailed description.

DETAILED DESCRIPTION OF THE INVENTION

Referring now to the drawings, wherein like reference numerals designate corresponding structure throughout the views.

Figure 1:
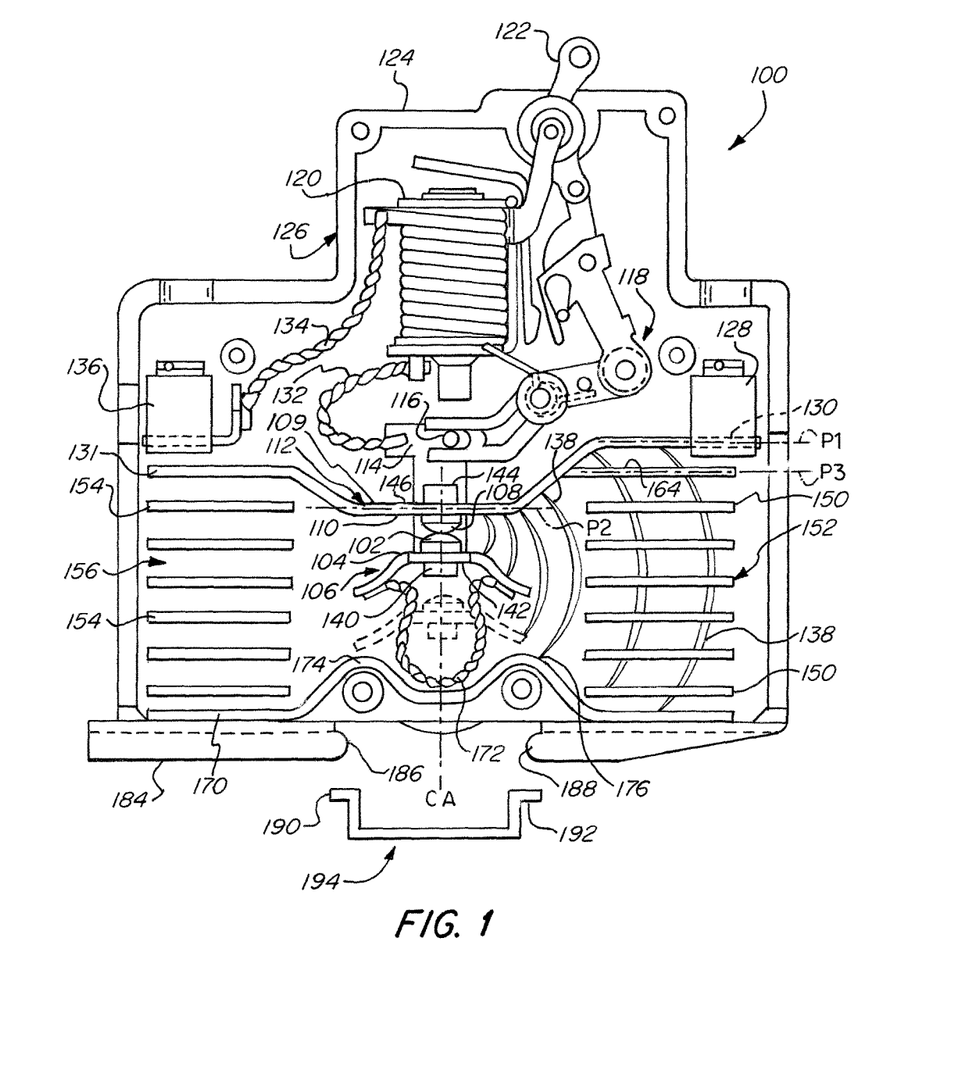
FIG. 1 is a side view of a circuit interrupter according to one aspect of the system.

FIG. 1 illustrates components of an example circuit interrupter 100 having polarity independent magnetic arc extinguishment features according to aspects of one configuration of the system.

The circuit interrupter is provided with a moveable contact mounted on an upper surface 104 of a moveable contact arm 106. The moveable contact arm 106 may be provided as a generally flat elongated piece and better illustrated in FIG. 3. Also illustrated in FIG. 1 is stationary contact 108 that is mounted in a middle portion 109 of stationary contact arm 112 on a lower surface 110 thereof.

The moveable contact arm 106 is coupled to a vertical plate 114 that includes a pin 116 connected to a linkage 118. The linkage 118 is coupled to both an overcurrent measurement device 120 and a handle 122 that extends out a top side 124 of a housing 126.

In operation, the moveable contact arm 106 will displace the moveable contact 102 along axis CA. The moveable contact 102 is illustrated in a "closed" position where moveable contact 102 is physically contacting stationary contact 108. Also shown in FIG. 1 is moveable contact 102 in an "open" position (dashed line) where moveable contact 102 has been moved a distance away from stationary contact 108 along axis CA.

The displacement of moveable contact arm 106 is controlled by the automatic actuation of the overcurrent measurement device 120 based on a measured current flow, or by the manual actuation of the handle 122 to open, reset and close the contacts.

Electrical power is provided to the circuit breaker 100 via line terminal 128, which is connected to first end 130 of stationary contact arm 112. Electrical power is then transferred to stationary contact arm 112, which is formed of a conductive material and then to stationary contact 108. If moveable contact 102 is in physical contact with stationary contact 108, electrical power is transmitted to moveable contact arm 104 and through vertical plate 114. Vertical plate 114 is connected to an input of overcurrent measurement device 120 via conductor 132. Electrical power is then passed from an output of overcurrent measurement device 120 via conductor 134 and to load terminal 136, which will supply power to the load (not shown).

Figure 3:
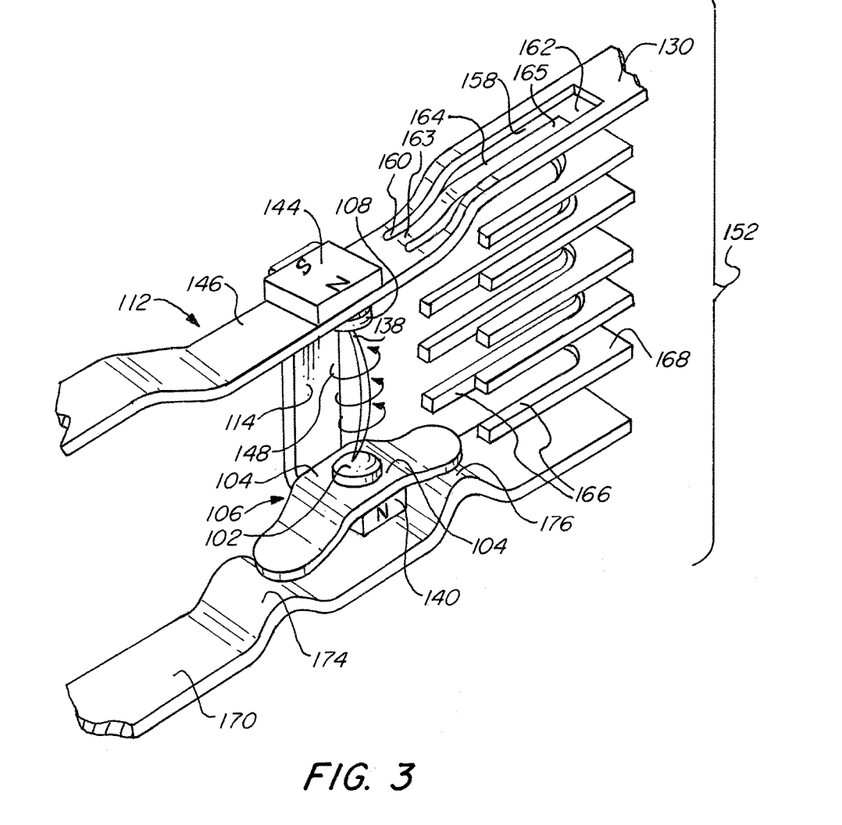
FIG. 3 is a perspective view of one of the arc chambers along with the contacts with an arc formed there between and the corresponding arc flux illustrated according to FIG. 1.

When the moveable contact 102 is displaced along axis CA away from stationary contact 108, it is contemplated that an arc 138 may form in the space between the contacts. As discussed previously, the formation of an arc can have deleterious effects on the circuit breaker 100 itself and surrounding equipment. Accordingly, it is advantageous to extinguish the arc 138 as quickly as possible. To accomplish this, a moveable magnet 140 is positioned on a lower surface 142 of moveable contact arm 106 and a stationary magnet 144 is positioned on an upper surface 146 of stationary contact arm 112. The moveable magnet 140 and stationary magnet 144 are oriented in the same direction such that the magnetic fields for each are additive when they come within proximity of each other. FIG. 3 further illustrates the additive magnetic field 148, which is illustrated by the counter-clockwise arrows extending around the arc 138 that has developed between the contacts.

Referring back to FIG. 1, it can be seen that a series of vertically stacked plates 150 are provided to the right of the contacts (FIG. 1) and forms a first arc extinguisher 152. Additionally, a series of vertically stacked plates 154 are provided to the left of the contacts (FIG. 1) and forms a second arc extinguisher 156. The first and second arc extinguishers 152, 156 function in a manner that is known in the art for drawing an arc away from the contact so as to quacking extinguish it to prevent damage to the circuit interrupter 100

As can be seen in FIGS. 1 and 3, the stationary contact arm 112 is provided with a cutout 158 (FIG. 3), which includes a proximal end 160 and a distal end 162. Also provided within cutout 158 is a center piece 164 including a proximal end 163 and a distal end 165. The proximal end 163 of center piece 164 is connected to stationary contact arm 112 at proximal end 160, but is not connected at the distal end 162. In one configuration, the stationary contact arm 112 is formed with first end 130 residing in a first plane P1 (FIG. 1) and middle portion 109 in a second plane P2 (FIG. 1). The center piece 164 is formed and resides in a third plane P3 (FIG. 1). Still further, the stationary contact arm 112 is also formed with a second end 131 in third plane P3.

As can be seen in FIG. 1, center piece 164 extends over and forms the upper most arc plate for the first arc extinguisher 152, whereas the end 130 of the stationary contact arm 112 is coupled to the line terminal 128.

Turning now to the configuration of the plates 150 of first arc extinguisher 152, the plates 150 may each be formed as a U shape configuration having two legs 166 that extend inward toward the contacts and are joined at a distal end 168. It is contemplated that the individual plates are held in place by the housing 124.

Also seen in FIG. 1 a lower arc runner 170 is illustrated that extends from the first arc extinguisher 152 to the second arc extinguisher 156. The lower arc shield is positioned such that it forms the lower most arc plate for both of the arc extinguishers 152, 156. In addition, a flexible conductor 172 is provided that electrically connects the moveable contact arm 106 to the lower arc runner 170. In one configuration, the flexible conductor 172 is coupled to the lower surface 142 of moveable contact arm 106. In another configuration, the flexible conductor 170 is connected at opposite ends of the moveable contact arm 106. It is contemplated that the flexible conductor 172 may be affixed to the moveable contact arm 106 and the lower arc runner 170 by a weld or any other suitable means of permanently bonding the flexible conductor 172 in place.

When the moveable contact arm 106 is moved to the open position, it can be seen that the ends of the moveable contact arm 106 come within close proximity to two raised portions 174, 176 of lower arc runner 170. This close proximity, along with the force of the magnetic field, urges any arc 138 that forms during opening of the contacts, to be transferred off of the contacts 102, 108, onto the stationary and moveable contact arms 106, 112 and onto the lower arc runner 170 and into the arc extinguisher 152, 156 depending on the polarity of the DC voltage.

Figure 4:
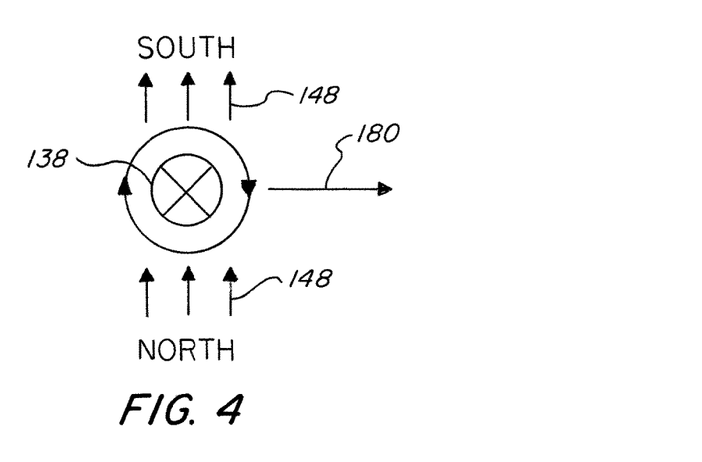
FIG. 4 is an illustration of the contacts with an arc formed there between based on a DC voltage of a first polarity and the direction the arc is urged toward to be extinguished according to FIG. 1.
Figure 5:
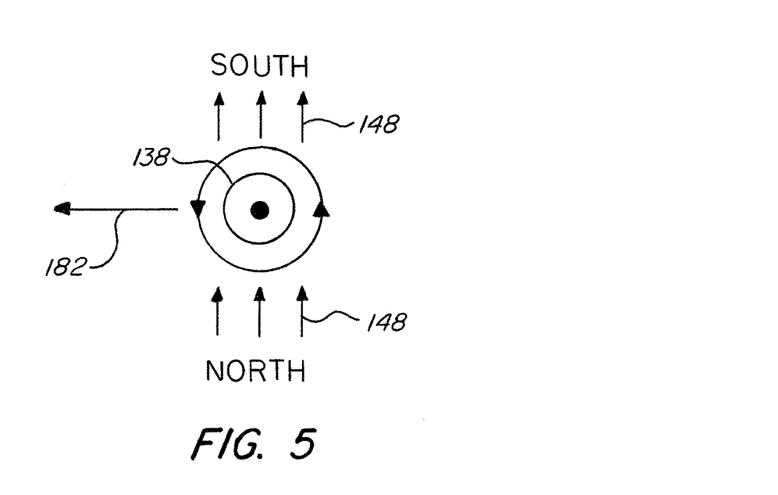
FIG. 5 is an illustration of the contacts with an arc formed there between based on a DC voltage of a second polarity and the direction the arc is urged toward to be extinguished according to FIG. 1.

The movement of the arc 138 into either the first or second arc extinguisher 152, 156 is further discussed in connection with FIGS. 4 and 5. Depending on the polarity of the DC voltage that is applied to the line terminal 130 the interaction of an arc 138 with the magnetic field 148 will have a tendency to drive the arc 138 in a first direction 180 or in a second direction 182 that is opposite to the first direction 180. The magnetic field 148 that is generated by moveable and the stationary magnets 140, 144 will be constant as the orientation of the magnets is fixed. This is illustrated in FIGS. 4 and 5 with the three parallel arrows that point from North to South in both figures. The interaction of the magnetic field 148 with the arc 138 will, however, be different depending on the polarity of the DC voltage. In FIG. 4 the arc 138 is driven toward first arc extinguisher 152, while in FIG. 5 the arc 138 is driven toward second arc extinguisher 156.

Figure 2:
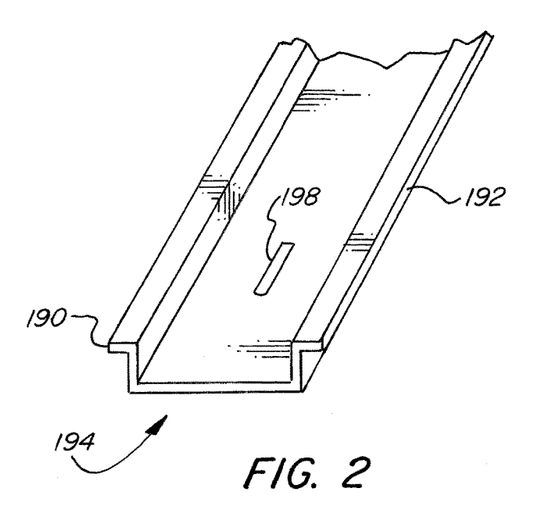
FIG. 2 is a perspective view of a DIN rail according to FIG. 1.

Turning back to FIG. 1 and with reference to FIG. 2, a lower portion 184 of housing 126 is provided with a first protrusion 186 and a second protrusion 188 that are designed to engage with opposing edges 190, 192 of DIN rail 194.

Second protrusion 188 is designed to interact with edge 192, wherein when engaged, the housing 124 can be rotated downward such that first protrusion 186 comes into contact with edge 190. With the application of downward force, first protrusion 186 deflects inward until it passes below edge 190 at which time first protrusion 186 again deflects outward and engages with edge 190 to firmly affix housing 124 to DIN rail 194. This makes for an easy to connect/disconnect circuit interrupter 100 that can be mounted anywhere a DIN rail 194 is mounted. To release the circuit interrupter 100 from DIN rail 194, one needs to apply mechanical force to end 196, which functions to disengage first protrusion 186 from edge 190. This allows the circuit interrupter 100 to be disengaged from DIN rail 194.

In one embodiment, the DIN rail 194 can be provided with a slot 198 to be surface mounted. However, it is contemplated that the circuit interrupter 100 can be mounted in a variety of ways in many differing applications as needed or desired.

It is contemplated that the various conductive portions of the circuit interrupter 100 can be supplied as a metal conductive material as is commonly used in the art, and the housing can be provided as an insulating material, such as a thermoset polyester resin material or the like, as is commonly used in the art.

Although the invention has been described with reference to a particular arrangement of parts, features and the like, these are not intended to exhaust all possible arrangements or features, and indeed many modifications and variations will be ascertainable to those of skill in the art.

What is claimed is:

1. A DC voltage circuit interrupter comprising:
    a stationary contact arm formed as a substantially flat elongated piece having a first end and a second end;
    a stationary contact positioned on an under side of and toward a middle portion of said stationary contact arm;
    a stationary magnet positioned on an upper side of and toward the middle portion of said stationary contact arm, said stationary magnet generating a stationary magnetic field;
    a moveable contact arm formed as a substantially flat elongated piece having a first end and a second end;
    a moveable contact positioned on an upper side of and toward a middle portion of said moveable contact arm;
    a moveable magnet positioned on an under side of and toward the middle portion of said moveable contact arm, said moveable magnet generating a moveable magnetic field;
    wherein the stationary magnet field and the moveable magnetic field are additive with respect to each other;
    said moveable contact arm displaceable along a linear path such that said moveable contact physically contacts said stationary contact in a closed position, and said moveable contact does not physically contact said stationary contact in an open position;
    a first arc extinguisher positioned below the first end of said stationary contact arm;
    a second arc extinguisher positioned below the second end of said stationary contact arm;
    wherein when an arc occurs between said stationary contact and said moveable contact, the magnetic fields urge the arc off of the contacts and onto the stationary contact arm and moveable contact arm and toward either said first or second arc extinguisher depending on a polarity of the DC voltage.

2. The DC voltage circuit interrupter according to claim 1 further comprising a lower arc runner extending from said first arc extinguisher to said moveable contact arm and to said second arc extinguisher.

3. The DC voltage circuit interrupter according to claim 2 wherein said moveable contact arm is coupled to said lower arc runner.

4. The DC voltage circuit interrupter according to claim 2 wherein the first and second ends of said movable contact arm extend downward toward said lower arc runner and said lower arc runner includes at least two portions that extend upwards, the at least two portions corresponding to the two ends of said moveable contact arm such that when said moveable contact transitions to the open position, the ends of said moveable contact arm come in proximity with the at least two portions of said arc runner.

5. The DC voltage circuit interrupter according to claim 1 wherein said stationary contact arm is formed having a first end on a first plane and middle portion on a second plane, where the first plane is different than the second plane.

6. The DC voltage circuit interrupter according to claim 5 wherein said stationary contact arm has a second end on a third plane, wherein the third plane is different from the first and second planes.

7. The DC voltage circuit interrupter according to claim 6 wherein said stationary contact arm provided with a cut out having a proximal end and a distal end extending longitudinally toward said first end of said stationary contact arm.

8. The DC voltage circuit interrupter according to claim 7 wherein said stationary contact arm comprises a center piece having a proximal and a distal end, where the proximal end of said center piece is attached at the proximal end of the cut out and the distal end of said center piece extends toward the distal end of the cut out.

9. The DC voltage circuit interrupter according to claim 8 wherein the distal end of said center piece is on the third plane.

10. The DC voltage circuit interrupter according to claim 8 wherein said center piece forms an uppermost arc plate of said first arc extinguisher.

11. The DC voltage circuit interrupter according to claim 10 wherein the first end of said stationary contact arm is terminated in a line terminal adapted to be coupled to a source of DC power to be input into said circuit interrupter.

12. The DC voltage circuit interrupter according to claim 10 wherein said center piece and the second end of said stationary contact arm are coplanar.

13. The DC voltage circuit interrupter according to claim 1 wherein said first arc extinguisher comprise a plurality of vertically stacked arc plates that are spaced apart from each other.

14. The DC voltage circuit interrupter according to claim 13 wherein said arc plates are formed as U shape, each arc plate having two legs that extend toward said contacts.

15. The DC voltage circuit interrupter according to claim 1 further comprising an overcurrent measurement device having an input coupled to said moveable contact.

16. The DC voltage circuit interrupter according to claim 15 further comprising a load terminal coupled to an output of said overcurrent measurement device.

17. The DC voltage circuit interrupter according to claim 15 further comprising a housing enclosing elements of the circuit interrupter, said housing having a handle extending from a top portion thereof and coupled to said overcurrent measurement device and said moveable contact arm via a linkage.

18. The circuit interrupter of claim 17 wherein said housing is configured to be detachably connectable to a DIN rail.

19. A DC voltage circuit interrupter comprising:
    a stationary contact arm formed as a substantially flat elongated piece having:
        a first end;
        a second end;
        an elongated cut out;
        a center piece attached to a proximal end of the elongated cut out and extending toward a distal end of the cut out;

said center piece being coplanar with said second end;
a stationary contact positioned on an under side of and toward a middle portion of said stationary contact arm;
a stationary magnet positioned on an upper side of and toward the middle portion of said stationary contact arm, said stationary magnet generating a stationary magnetic field;
a moveable contact arm formed as a substantially flat elongated piece having a first end and a second end;
a moveable contact positioned on an upper side of and toward a middle portion of said moveable contact arm;
a moveable magnet positioned on an under side of and toward the middle portion of said moveable contact arm, said moveable magnet generating a moveable magnetic field;
said moveable contact arm displaceable along a linear path such that said moveable contact physically contacts said stationary contact in a closed position, and said moveable contact does not physically contact said stationary contact in an open position;
a first arc extinguisher positioned below the center piece;
a second arc extinguisher positioned below the second end of said stationary contact arm.

20. The DC voltage circuit interrupter according to claim 19 further comprising a lower arc runner extending from said first arc extinguisher to said second arc extinguisher.

21. The DC voltage circuit interrupter according to claim 20 wherein said moveable contact arm is coupled to said lower arc runner.

22. The DC voltage circuit interrupter according to claim 19 wherein said stationary contact arm is formed having a first end on a first plane and middle portion on a second plane, where the first plane is different than the second plane.

23. The DC voltage circuit interrupter according to claim 22 wherein said stationary contact arm has a second end on a third plane, wherein the third plane is different from the first and second planes.

24. The DC voltage circuit interrupter according to claim 19 wherein the first end of said stationary contact arm is terminated in a line terminal adapted to be coupled to a source of DC power to be input into said circuit interrupter.

25. The DC voltage circuit interrupter according to claim 19 wherein said center piece forms an uppermost arc plate of said first arc extinguisher.

26. The DC voltage circuit interrupter according to claim 19 wherein said first arc extinguisher comprise a plurality of vertically stacked arc plates that are spaced apart from each other.

27. The DC voltage circuit interrupter according to claim 26 wherein said arc plates are formed as a U shape, each arc plate having two legs that extend toward said contacts.

28. The DC voltage circuit interrupter according to claim 19 further comprising an overcurrent measurement device having an input coupled to moveable contact and a load terminal coupled to an output of said overcurrent measurement device.

29. The DC voltage circuit interrupter according to claim 27 further comprising a housing enclosing the elements of the circuit interrupter, said housing having a handle extending from a top portion thereof and coupled to said overcurrent measurement device and said moveable contact arm via a linkage.

30. The circuit interrupter of claim 29 wherein said housing is configured to be detachably connectable to a DIN rail.

* * * * *